(12) United States Patent
Hirobe

(10) Patent No.: US 12,183,651 B2
(45) Date of Patent: Dec. 31, 2024

(54) SEMICONDUCTOR DEVICE

(71) Applicant: Amkor Technology Japan, Inc., Oita (JP)

(72) Inventor: Masao Hirobe, Yokohama (JP)

(73) Assignee: Amkor Technology Japan, Inc., Oita (JP)

(*) Notice: Subject to any disclaimer, the term of this patent is extended or adjusted under 35 U.S.C. 154(b) by 0 days.

(21) Appl. No.: 17/977,957

(22) Filed: Oct. 31, 2022

(65) Prior Publication Data

US 2023/0111868 A1   Apr. 13, 2023

Related U.S. Application Data

(63) Continuation of application No. 16/592,213, filed on Oct. 3, 2019, now Pat. No. 11,488,886, which is a
(Continued)

(30) Foreign Application Priority Data

Feb. 9, 2015   (JP) .................................. 2015-023153

(51) Int. Cl.
*H01L 23/367* (2006.01)
*H01L 23/00* (2006.01)
(Continued)

(52) U.S. Cl.
CPC .......... *H01L 23/3675* (2013.01); *H01L 23/04* (2013.01); *H01L 23/10* (2013.01);
(Continued)

(58) Field of Classification Search
CPC ..... H01L 23/3675; H01L 23/04; H01L 23/10; H01L 24/17
See application file for complete search history.

(56) References Cited

U.S. PATENT DOCUMENTS 5,931,222 A * 8/1999 Toy .......................... H01L 23/42
361/708
6,020,221 A   2/2000 Lim et al.
(Continued)

FOREIGN PATENT DOCUMENTS

| CN | 1153401 A | 11/2003 |
| CN | 1802747 A | 7/2006 |

(Continued)

OTHER PUBLICATIONS

Japanese Office Action mailed on May 29, 2018 for the corresponding Japanese application No. 2015-023153.
(Continued)

*Primary Examiner* — Shih Tsun A Chou
(74) *Attorney, Agent, or Firm* — Spectrum IP Law Group LLC

(57) ABSTRACT

There is provided a semiconductor device including a substrate whose surface is made of an insulation material, a semiconductor chip flip-chip connected on the substrate, and a heat sink bonded to the semiconductor chip via a thermal interface material and fixed to the substrate outside the semiconductor chip, in which the heat sink has a protrusion part protruding toward the substrate and bonded to the substrate via a conductive resin between a part bonded to semiconductor chip and a part fixed to the substrate and the heat sink has a stress absorbing part. According to the present invention, the protrusion part of the heat sink is prevented from being peeled off from the substrate at the part where the protrusion part of the heat sink is bonded to the substrate.

19 Claims, 10 Drawing Sheets

Related U.S. Application Data continuation of application No. 15/018,563, filed on Feb. 8, 2016, now abandoned.

(51) Int. Cl.
*H01L 23/04* (2006.01)
*H01L 23/10* (2006.01)
*H01L 23/373* (2006.01)

(52) U.S. Cl.
CPC .......... *H01L 24/17* (2013.01); *H01L 23/3736* (2013.01); *H01L 23/562* (2013.01); *H01L 24/13* (2013.01); *H01L 24/16* (2013.01); *H01L 24/29* (2013.01); *H01L 24/32* (2013.01); *H01L 24/73* (2013.01); *H01L 2224/13101* (2013.01); *H01L 2224/13139* (2013.01); *H01L 2224/13144* (2013.01); *H01L 2224/13147* (2013.01); *H01L 2224/16225* (2013.01); *H01L 2224/2919* (2013.01); *H01L 2224/29193* (2013.01); *H01L 2224/32225* (2013.01); *H01L 2224/32245* (2013.01); *H01L 2224/73204* (2013.01); *H01L 2224/73253* (2013.01); *H01L 2924/01013* (2013.01); *H01L 2924/01014* (2013.01); *H01L 2924/01029* (2013.01); *H01L 2924/059* (2013.01); *H01L 2924/10253* (2013.01); *H01L 2924/10272* (2013.01); *H01L 2924/1033* (2013.01); *H01L 2924/14* (2013.01); *H01L 2924/16153* (2013.01); *H01L 2924/1616* (2013.01); *H01L 2924/3511* (2013.01)

(56) References Cited

U.S. PATENT DOCUMENTS

| | | |
|---|---|---|
| 6,313,521 B1 | 11/2001 | Baba |
| 6,429,511 B2 | 8/2002 | Ruby et al. |
| 6,472,741 B1 | 10/2002 | Chen et al. |
| 6,775,140 B2 | 8/2004 | Shim et al. |
| 6,817,091 B2 | 11/2004 | Fitzgerald et al. |
| 7,619,308 B1 | 11/2009 | Gektin et al. |
| 7,928,562 B2 | 4/2011 | Arvelo et al. |
| 8,013,438 B2 | 9/2011 | Luan et al. |
| 8,976,529 B2 | 3/2015 | Lin et al. |
| 9,059,143 B2 | 6/2015 | Imaizumi et al. |
| 9,147,649 B2 | 9/2015 | Landau et al. |
| 9,418,909 B1 | 8/2016 | Chaware et al. |
| 9,437,519 B2 | 9/2016 | Mcvicker et al. |
| 9,812,377 B2 | 11/2017 | Yamada et al. |
| 9,887,144 B2 | 2/2018 | Lin et al. |
| 2003/0085475 A1 | 5/2003 | Im et al. |
| 2004/0075987 A1 | 4/2004 | Shim et al. |
| 2004/0118500 A1 | 6/2004 | Wang |
| 2004/0212097 A1 | 10/2004 | Chen et al. |
| 2004/0238944 A1 | 12/2004 | Bish et al. |
| 2006/0261467 A1 | 11/2006 | Colgan et al. |
| 2008/0017975 A1 | 1/2008 | Deppisch et al. |
| 2008/0128897 A1 | 6/2008 | Chao |
| 2009/0189291 A1 | 7/2009 | Landau et al. |
| 2010/0299918 A1* | 12/2010 | Oda .................. H01L 23/3733 29/841 |
| 2011/0018125 A1 | 1/2011 | Loo et al. |
| 2011/0149537 A1 | 6/2011 | Kurosawa |
| 2012/0025367 A1 | 2/2012 | Imaizumi et al. |
| 2012/0182694 A1* | 7/2012 | Lin .......................... H01L 23/16 361/728 |
| 2013/0062752 A1* | 3/2013 | Lin .......................... H01L 23/36 257/729 |
| 2013/0119529 A1* | 5/2013 | Lin ..................... H01L 23/3675 438/118 |
| 2014/0027920 A1 | 1/2014 | Kodama |
| 2014/0061893 A1 | 3/2014 | Saeidi et al. |
| 2014/0077349 A1 | 3/2014 | Higgins |
| 2014/0091461 A1 | 4/2014 | Shen |
| 2014/0134804 A1 | 5/2014 | Kelly et al. |
| 2014/0197533 A1 | 7/2014 | Imamura et al. |
| 2015/0129189 A1 | 5/2015 | Wang |
| 2015/0243570 A1 | 8/2015 | Mcvicker et al. |
| 2015/0327397 A1* | 11/2015 | Murayama ........... H05K 7/2039 165/185 |
| 2016/0035637 A1 | 2/2016 | Urago et al. |

FOREIGN PATENT DOCUMENTS

| | | |
|---|---|---|
| CN | 101111935 A | 1/2008 |
| CN | 201708146 U | 1/2011 |
| CN | 102593072 A | 7/2012 |
| CN | 103715150 A | 7/2017 |
| JP | S59231841 A | 12/1984 |
| JP | H10125830 A | 5/1998 |
| JP | 2003152149 A | 5/2003 |
| JP | 2011134769 A | 7/2011 |
| JP | 2012033559 A | 2/2012 |
| TW | I315094 B | 9/2009 |

OTHER PUBLICATIONS

Notice of Preliminary Rejection mailed on Feb. 23, 2022, for Korean Patent Application No. 10-2016-127701.
Office action issued on Dec. 20, 2019, to TW Patent Application No. 105103225.
Office Action mailed on Dec. 27, 2018 for corresponding Chinese application No. 201610068904.7.
Office action received on Mar. 3, 2021, for TW Patent Application No. 109133883.
Official Letter and Search Report mailed Jan. 26, 2022 in Taiwan Application No. 109133883.
Search Report received from Taiwan Patent Application No. 105103225, mailed Jan. 8, 2020, 12 pages (Full Translation Provided).
Second Office action issued on Sep. 6, 2019, to CN Patent Application No. 20161006894.7.
Chinese Office Action mailed on Jan. 30, 2023, for CN Application No. 202010330026.8.
Korean Office Action mailed on Mar. 17, 2023, for KR Application No. 10-2023-0006210.
Office Action for Korean Application No. 10-2023-0165240 mailed Nov. 11, 2024.

* cited by examiner

SEMICONDUCTOR DEVICE

CROSS REFERENCE TO RELATED APPLICATIONS

The present application is a continuation of U.S. application Ser. No. 16/592,213 filed Oct. 3, 2019, now U.S. Pat. No. 11,488,886, which in turn is a continuation of U.S. application Ser. No. 15/018,563 filed Feb. 8, 2016, abandoned. Said application Ser. No. 15/018,563 is based on and claims the benefit of priority to the prior Japanese Patent Application No. 2015-023153, filed on Feb. 9, 2015, the entire contents of which are incorporated herein by reference.

FIELD

The present invention relates to a semiconductor device and in particular to a technique for a flip-chip bonding (FCB) package with a low-stress heat sink.

BACKGROUND

According to increase in the speed of the operation of a semiconductor device and the number of inputs/outputs thereof, heat generated from the semiconductor device also increases. For this reason, there has been known a semiconductor package in which a heat sink is bonded to a semiconductor chip. There also has been known that a ground is stabilized such that the heat sink is connected to the ground of a substrate of the package to decrease noise of a high speed device.

A Japanese Patent Laid-Open No. 2012-33559, for example, discloses a semiconductor device in which a heat radiation member is embedded in a sealing member for embedding a semiconductor chip to improve heat radiation. According to the semiconductor device disclosed in the Japanese Patent Laid-Open No. 2012-33559, an appropriate surface area of the heat radiation member can improve the heat radiation of the semiconductor device, which allows the thermal resistance thereof to be reduced.

However, it may cause a problem that the heat sink provided for improving the heat radiation is peeled off by stress accompanied with thermal expansion or thermal shrinkage.

SUMMARY

A semiconductor device according to an embodiment of the present invention including a substrate whose surface is made of an insulation material, a semiconductor chip flip-chip connected on the substrate, and a heat sink bonded to the semiconductor chip via a thermal interface material and fixed to the substrate outside the semiconductor chip, wherein the heat sink has a protrusion part protruding toward the substrate and bonded to the substrate via a conductive resin between a part bonded to semiconductor chip and a part fixed to the substrate and the heat sink has a stress absorbing part.

The stress absorbing part may has lower rigidity than the part excluding the stress absorbing part of the heat sink.

The stress absorbing part may be thinned by a groove provided on the surface of the heat sink opposing the substrate.

The number of the grooves provided thereon may be two or more.

The protrusion part may be arranged to surround the semiconductor chip and the stress absorbing part may be arranged inside or outside the protrusion part.

The stress absorbing part may be arranged adjacent to the protrusion part.

The stress absorbing part may include a bottomed hole provided in the surface of the heat sink opposing the substrate or a through hole.

The heat sink may be made of Cu, Al, or AlSiCu ceramic.

The protrusion part may be bonded an electrode arranged on the substrate via the conductive resin, and the electrode may be electrically connected to a ground.

DESCRIPTION OF EMBODIMENTS

Figure 1:
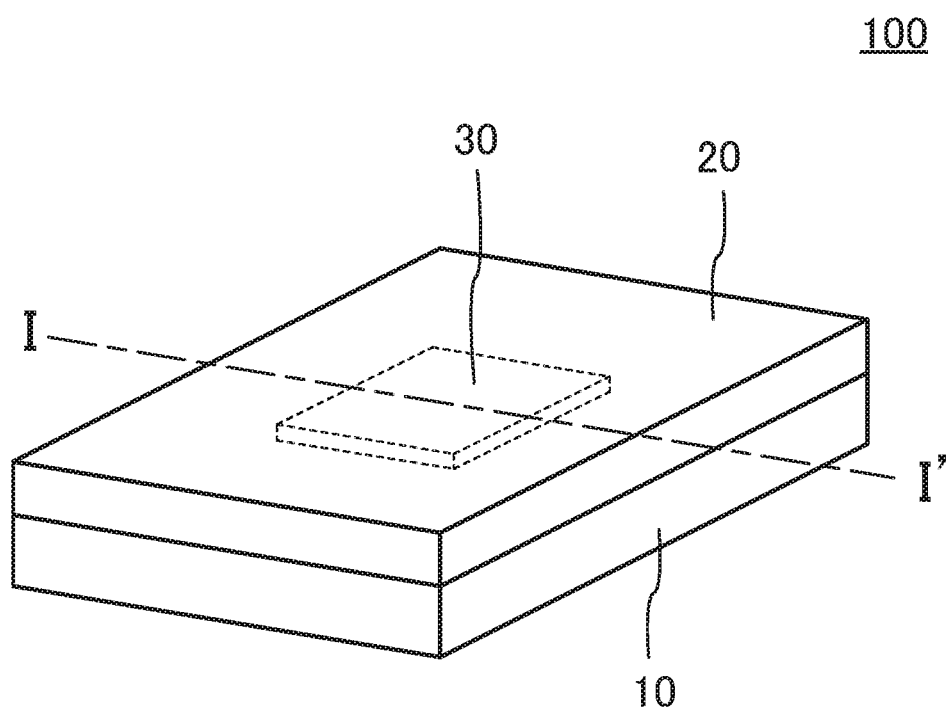
FIG. 1 is a schematic diagram of a semiconductor device according to a first embodiment of the present invention.

The present invention provides a highly reliable semiconductor device which prevents the heat sink from being peeled off from the substrate by stress accompanied with thermal expansion and thermal shrinkage.

The semiconductor device according to the present invention is described below with reference to the attached drawings. The semiconductor device according to the present invention can be implemented in many different embodiments and shall not be interpreted by limiting to the description of the embodiments shown below. In the drawings referred in the present embodiments, the same components or the components having similar functions are given the same reference number and a repetitive description thereof is omitted.

First Embodiment

The structure of the semiconductor device according to the first embodiment is described with reference to FIGS. 1 to 3.

[Structure of Semiconductor Device]

FIG. 1 is a schematic diagram showing a structure of a semiconductor device 100 according to a first embodiment of the present invention. The semiconductor device 100 comprises a substrate 10, a semiconductor chip 30 is arranged on the substrate 10 and a heat sink 20 is arranged on the substrate 10 and the semiconductor chip 30. The substrate 10 and the heat sink 20 are arranged in opposition to each other. Both the substrate 10 and the heat sink 20 has substantially the same area. The semiconductor device 100 is nearly cubic.

[Cross Section of Semiconductor Device]

Figure 2:
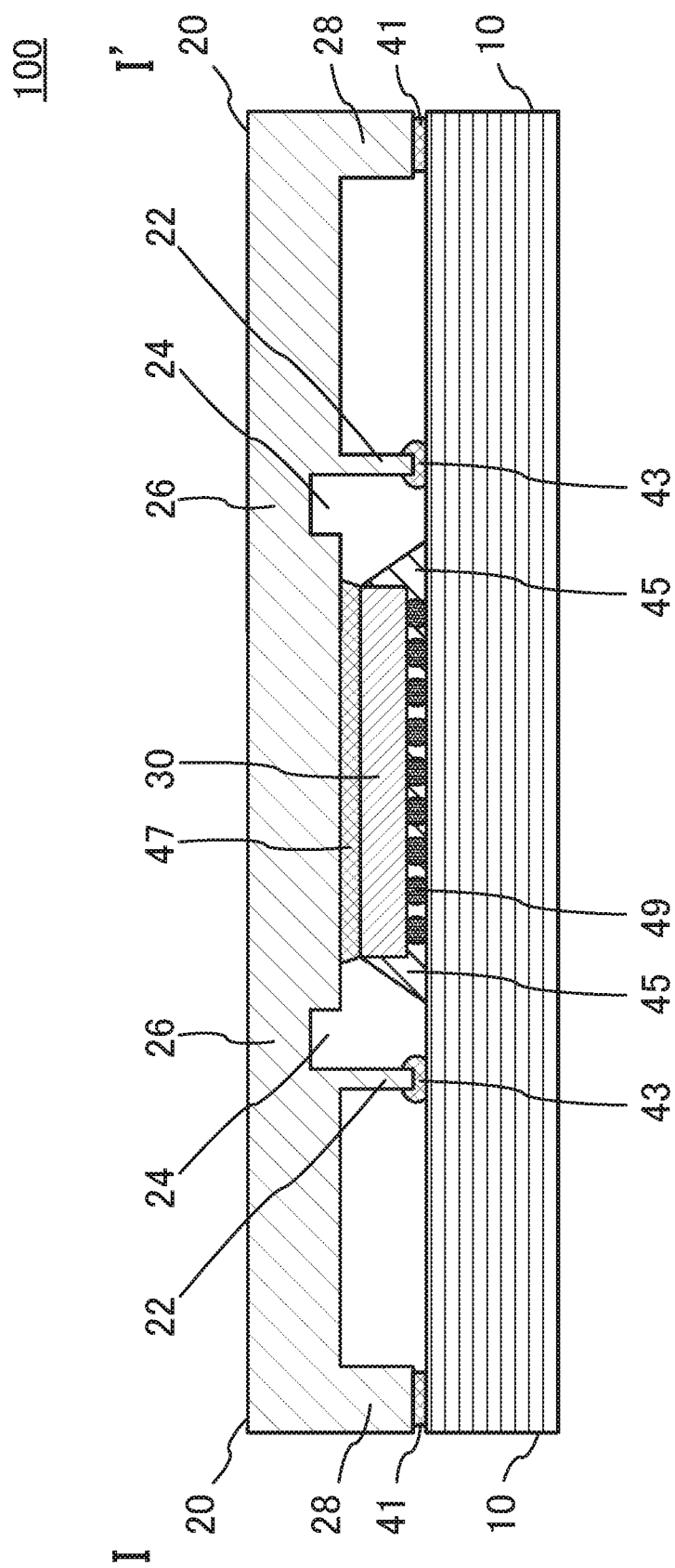
FIG. 2 is a cross section of the semiconductor device according to the first embodiment of the present invention.

FIG. 2 is a cross section along the line I-I' in FIG. 1 in the semiconductor device 100 according to the first embodiment of the present invention.

The substrate 10 is a package substrate (a supporting substrate) and an organic substrate using an organic material such as polyimide or epoxy resin. The substrate 10 may be a multilayered buildup substrate. Electrodes electrically connected with the semiconductor chip 30 and a protrusion part 22 are arranged on a surface of the substrate 10 opposing the heat sink 20. An electrode electrically connected with elements except the semiconductor chip 30, an external device, or another substrate may be appropriately arranged on another surface of the substrate 10. Except for the electrodes described above, the surfaces of the substrate 10 are generally composed of insulation materials such as the organic material forming the substrate 10, an epoxy resin coating material coated on the substrate 10, thermosetting epoxy insulation film, or the like.

The semiconductor chip 30 is arranged on the substrate 10. The semiconductor chip 30 is flip-chip connected to the substrate 10 via a conductive bump 49. Cupper (Cu), silver (Ag), gold (Au), and solder may be used as the bump 49. The semiconductor chip 30 is a semiconductor element such as an IC chip, an LSI chip, or the like. A semiconductor element using silicon (Si) as a main material is used as the semiconductor chip 30, however, silicon carbide (SiC) or gallium nitride (GaN) may be used as main materials of the semiconductor chip 30. The first embodiment shows an example where one semiconductor element is arranged on the substrate, however, a plurality of semiconductor elements may be arranged side by side or a plurality of semiconductor elements may be stacked one on top of another on the substrate.

An underfill 45 for fixing the semiconductor chip 30 is arranged between the substrate 10 and the semiconductor chip 30. Epoxy resin, cyanate ester resin, acryl resin, polyimide resin, silicone resin or the like may be used as the underfill 45.

The heat sink 20 is arranged on the semiconductor chip 30 via a thermal interface material 47. A known thermal conduction material (TIM) is used as the thermal interface material 47. A heat radiation sheet, graphite, thermal conduction grease or the like, for example, may be used as the thermal interface material 47. A material high in thermal conductivity and adhesive property is used as the thermal interface material 47 to effectively transfer the heat of the semiconductor chip 30 to the heat sink 20. Cupper (Cu), aluminum (Al), AlSiCu ceramics or the like may be used as the heat sink 20.

A fixing part 28 protruding toward the substrate 10 is provided near the outer periphery of the heat sink 20. The fixing part 28 of the heat sink 20 is fixed to the substrate 10 by an adhesive 41. The adhesive 41 may be insulative or conductive. If the protrusion part 22 and a stress absorbing part 26 described later are neglected, the heat sink 20 has a shape of a lid having the fixing part 28 protruding toward the substrate 10, near the outer periphery of the heat sink 20. The side face of the substrate 10 and that of the heat sink 20 are arranged on substantially the same plane, however, the side face of the heat sink 20 may be positioned nearer the center of the semiconductor device 100 than the side face of the substrate 10, or contrarily, the side face of the heat sink 20 may be positioned farther from the center of the semiconductor device 100 than the side face of the substrate 10.

The heat sink 20 has the protrusion part 22 protruding toward the opposing substrate 10 in addition to the fixing part 28 described above. The protrusion part 22 is arranged between a part bonded to the semiconductor chip 30 and the fixing part 28. The protrusion part 22 is bonded to the substrate 10 via a conductive adhesive 43. An electrode electrically connected to the ground of the substrate 10 is arranged on the part of the substrate 10 bonded to the protrusion part 22. In other words, the protrusion part 22 is electrically connected with the ground of the substrate 10 via the electrode and arranged to stabilize the ground of the substrate 10. It is preferable that the protrusion part 22 is arranged in a position near the semiconductor chip 30 from the viewpoint of the stabilization of the ground.

The stress absorbing part 26 is arranged between the part bonded to the semiconductor chip 30 and the protrusion part 22 on the heat sink 20 of the semiconductor device 100 according to the first embodiment of the present invention. More specifically, a recessed groove 24 is formed between the part bonded to the semiconductor chip 30 and the protrusion part 22 on the surface of the heat sink 20 opposing the substrate 10. If the fixing part 28 and the protrusion part 22 on the heat sink 20 are neglected, the heat sink 20 has a fixed thickness, however, the stress absorbing part 26 is formed such that the part where the groove 24 is arranged is thinner than the periphery of the groove 24. The fixing part 28, the protrusion part 22, and the groove 24 of the heat sink 20 may be formed by etching.

[Planar Configuration of Heat Sink 20]

Figure 3A:
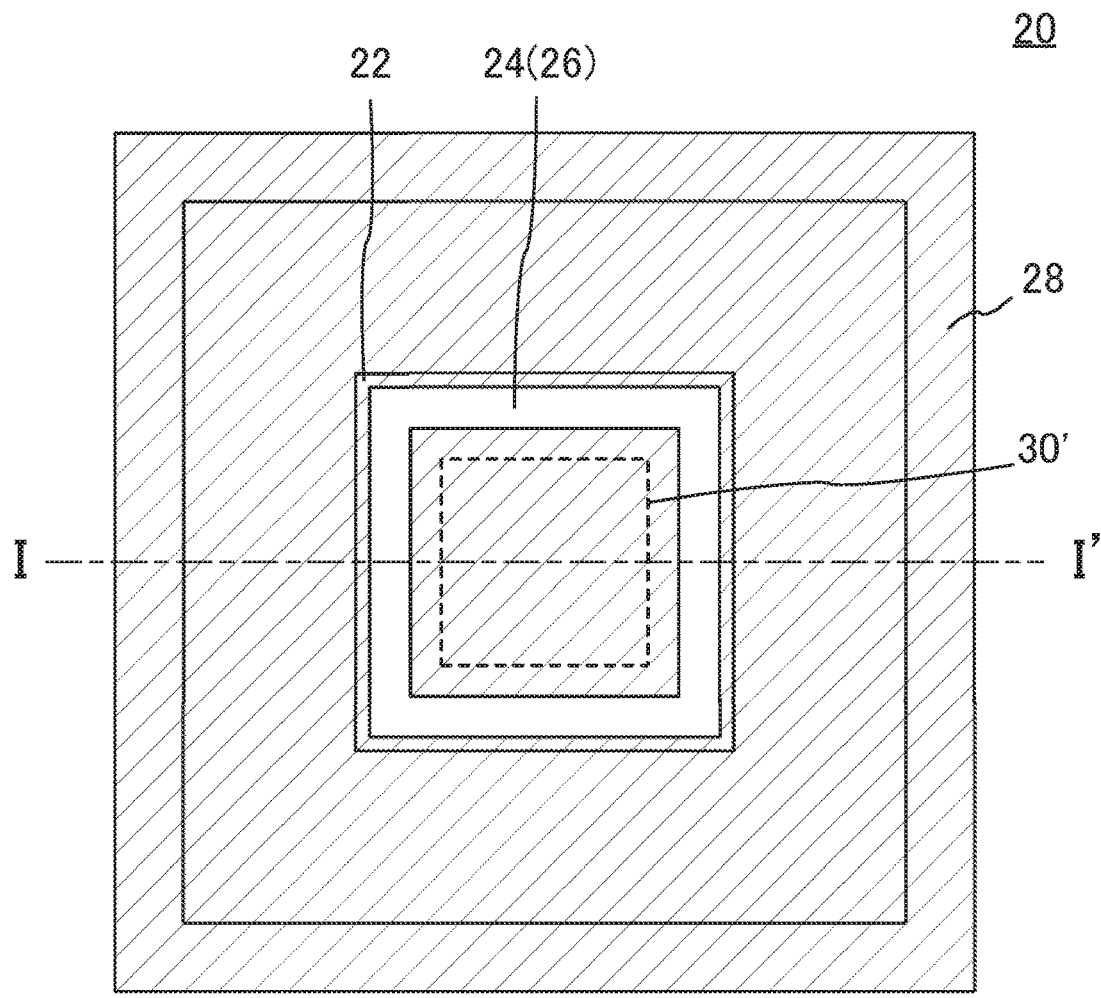
FIG. 3A is a top view of a heat sink of the semiconductor device according to the first embodiment of the present invention.
Figure 3B:
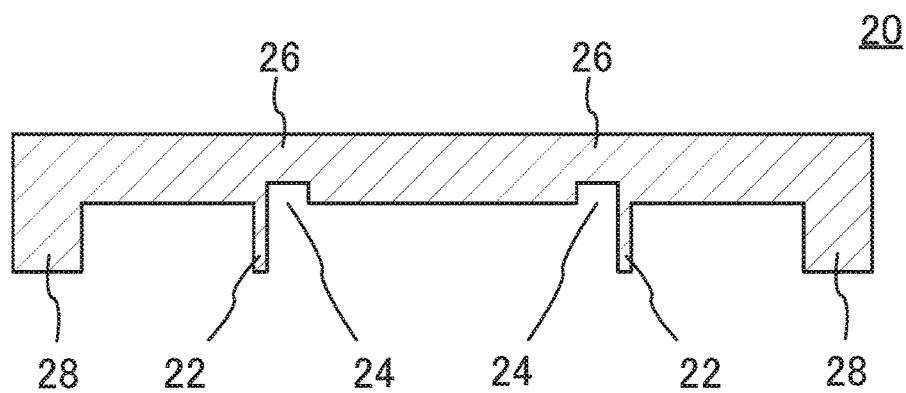
FIG. 3B is a cross section of the heat sink of the semiconductor device according to the first embodiment of the present invention.

FIG. 3A is a top view of the heat sink 20 of the semiconductor device according to the first embodiment of the present invention. FIG. 3B is a cross section of the heat sink 20 along the line I-I' in FIG. 3A. A rectangular area 30' surrounded by a dotted line shows a position where the heat sink 20 is bonded to the semiconductor chip 30 (not shown). The protrusion part 22 is arranged in a rectangular shape so as to surround the area 30' bonded to the semiconductor chip 30. Furthermore, the fixing part 28 bonded and fixed to the substrate 10 (not shown) is arranged on the outer periphery of the heat sink 20. In the first embodiment, the groove 24 (the stress absorbing part 26) is arranged between the area 30' bonded to the semiconductor chip 30 and the protrusion part 22. Preferably, the groove 24 is arranged in proximity to a position where the protrusion part 22 is arranged. More preferably, the groove 24 is arranged adjacent to the position where the protrusion part 22 is arranged. As is the case with the protrusion part 22, the groove 24 (the stress absorbing part 26) is also arranged in a rectangular shape so as to surround the area 30' bonded to the semiconductor chip 30.

The substrate 10 and the semiconductor chip 30 included in the semiconductor device 100 use an organic substrate and silicon as main materials respectively. The thermal expansion coefficient of the substrate 10 is about 15 ppm and that of the semiconductor chip 30 is about 3.4 ppm. Thus, the value of the thermal expansion coefficient of the substrate 10 is greater than the value of that of the semiconductor chip 30. For this reason, at a low temperature (−55° C., for example) in a temperature cyclic test, the semiconductor device 100 is totally convexly-warped toward the upper surface (toward the upper side in FIG. 2 and the surface on which the heat sink 20 is arranged) because the substrate 10 is greater in shrinkage. The substrate 10 is firmly bonded and fixed to the heat sink 20 by the adhesive 41 in the neighborhood of the outer circumference of the semiconductor device 100. The heat sink 20 is firmly bonded and fixed to the semiconductor chip 30 by the thermal interface material 47. Thus, the heat sink 20 is firmly bonded and fixed to the substrate 10 and the semiconductor chip 30, so that the heat sink 20 is subjected to stress in a warping direction at a low temperature in the temperature cyclic test.

The heat sink 20 of the semiconductor device 100 according to the first embodiment of the present invention has the recessed groove 24 between the part bonded to the semiconductor chip 30 and the fixing part 28 fixed to the substrate 10. The stress absorbing part 26 is formed in the heat sink 20 by the groove 24. In other words, the groove 24 is provided for the heat sink 20 to form the stress absorbing part 26 in which the heat sink 20 at the part where the groove 24 is formed is thinner than the heat sink 20 at the part where the groove 24 is not formed. The stress absorbing part 26 can reduce the distortion of the heat sink 20 caused by heat. In other words, the stress absorbing part 26 of the heat sink 20 has lower rigidity than the surroundings thereof. Thus, arranging the part having low rigidity in the heat sink 20 allows the thermal stress of the heat sink 20 to be reduced. For example, the stress absorbing part 26 is arranged in the heat sink 20 to allow the warp of the semiconductor device 100 to be reduced at a low temperature in the temperature cyclic test. This can reduce stress caused by a warp of the semiconductor device 100 at the part where the protrusion part 22 of the heat sink 20 is bonded to the substrate 10, which can prevent the protrusion part 22 from being peeled off from the substrate 10 at the part.

Second Embodiment

The outline of the semiconductor device according to the second embodiment of the present invention is described below with reference to FIGS. 4A and 4B.

Figure 4A:
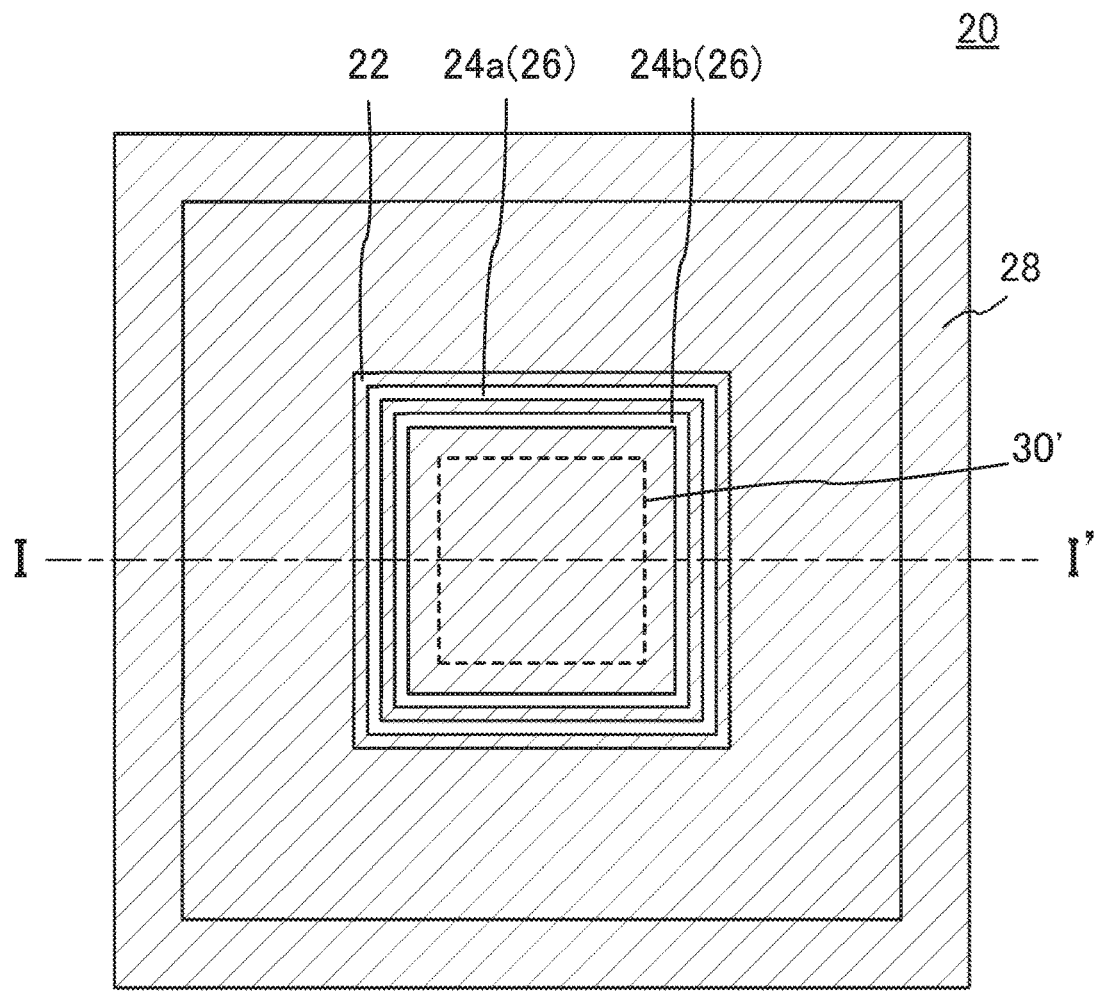
FIG. 4A is a top view of a heat sink of a semiconductor device according to a second embodiment of the present invention.
Figure 4B:
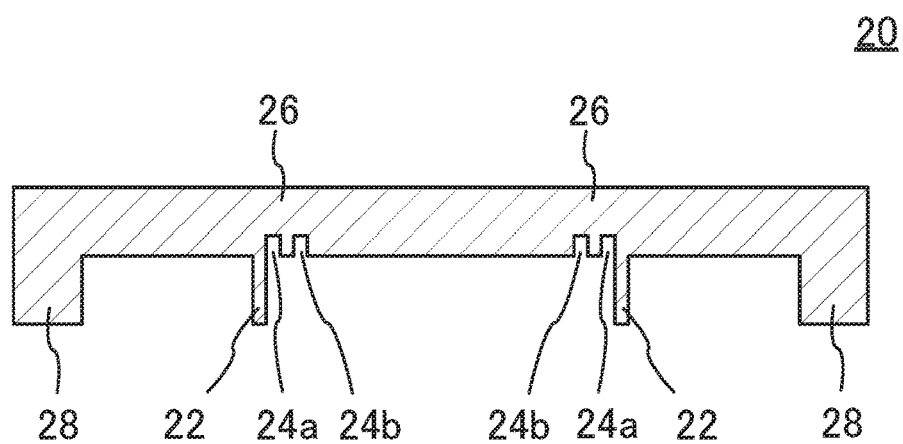
FIG. 4B is a cross section of the heat sink of the semiconductor device according to the second embodiment of the present invention.

FIG. 4A is a top view of the heat sink 20 of the semiconductor device according to the second embodiment. FIG. 4B is a cross section of the heat sink 20 along the line I-I' in FIG. 4A. The second embodiment is characterized in that two grooves 24a and 24b are arranged in the heat sink 20 to form the stress absorbing part 26. The grooves 24a and 24b are formed between an area 30' bonded to the semiconductor chip 30 and the protrusion part 22. As is the case with the groove 24 in the first embodiment, the groove 24a is preferably arranged in proximity to a position where the protrusion part 22 is arranged. The groove 24a is more preferably arranged adjacent to the position where the protrusion part 22 is arranged. As is the case with the groove 24 in the first embodiment, the groove 24a is formed in a rectangular shape viewed from the top so as to surround the area 30'. The grooves 24b is arranged between the groove 24a and the area 30' bonded to the semiconductor chip 30. As is the case with the groove 24a, the groove 24b is formed also in a rectangular shape viewed from the top so as to surround the area 30'.

In the second embodiment, the two grooves 24a and 24b are arranged between the area 30' bonded to the semiconductor chip 30 and the protrusion part 22 to further reduce the rigidity of the stress absorbing part 26 than that in the first embodiment, which allows the stress to be further reduced at the part where the protrusion part 22 of the heat sink 20 is bonded to the substrate 10.

Third Embodiment

The outline of the semiconductor device according to the third embodiment of the present invention is described below with reference to FIGS. 5A and 5B.

Figure 5A:
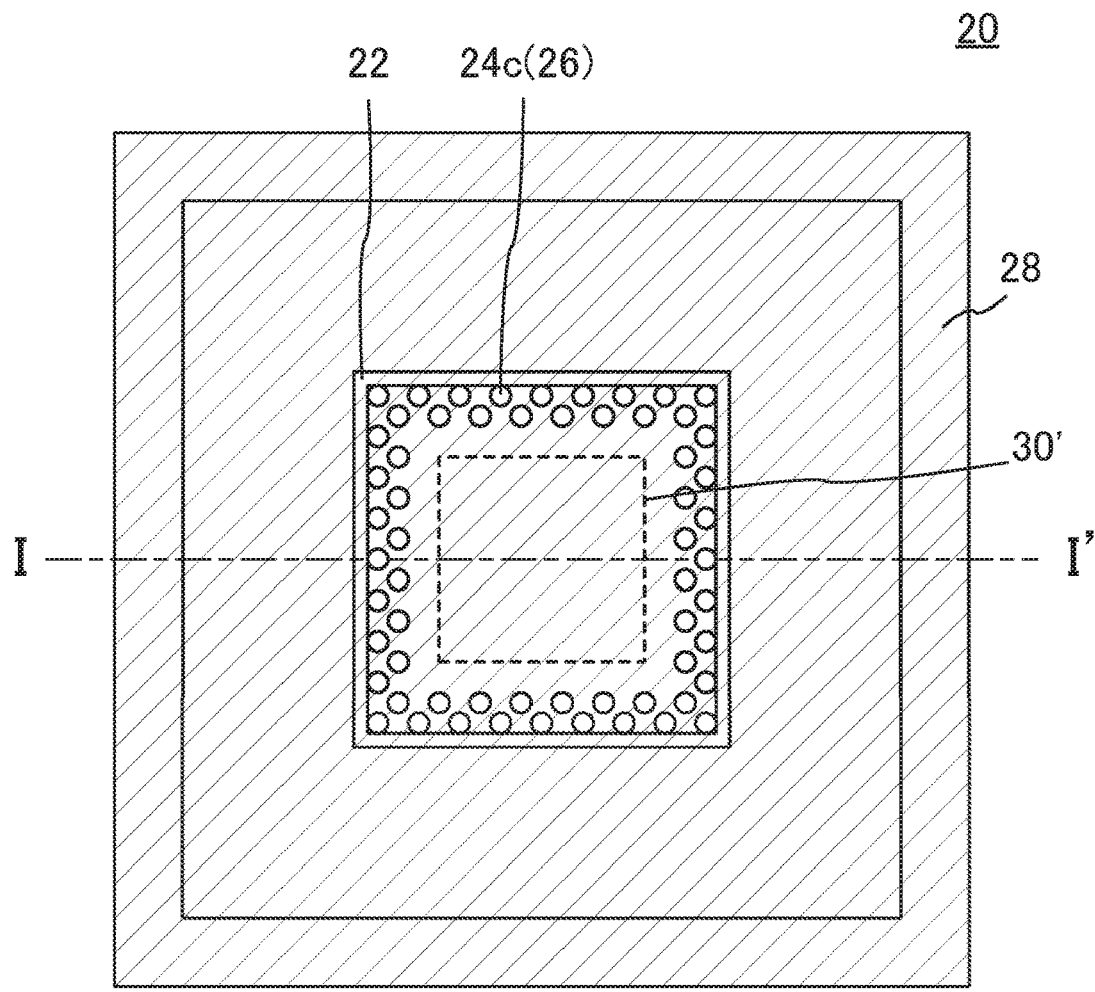
FIG. 5A is a top view of a heat sink of a semiconductor device according to a third embodiment of the present invention.
Figure 5B:
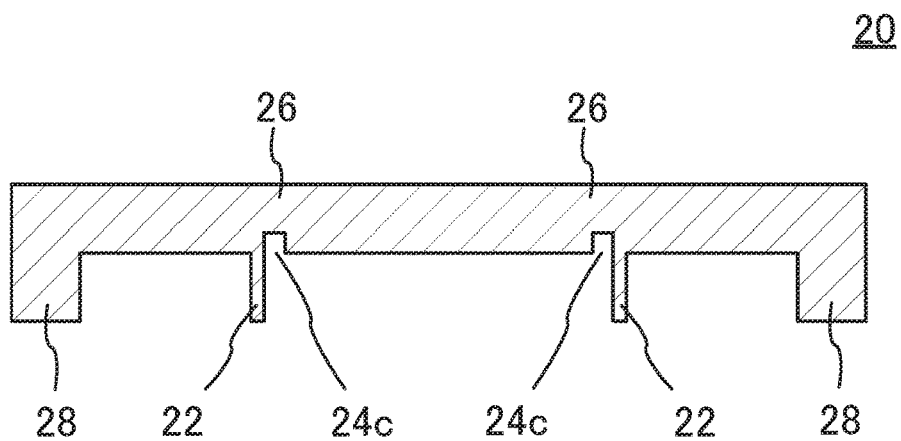
FIG. 5B is a cross section of the heat sink of the semiconductor device according to the third embodiment of the present invention.

FIG. 5A is a top view of the heat sink 20 of the semiconductor device according to the third embodiment. FIG. 5B is a cross section of the heat sink 20 along the line I-I' in FIG. 5A. The third embodiment is characterized in that a bottomed hole 24c is arranged in the heat sink 20 to form the stress absorbing part 26. The bottomed hole 24c is arranged between the area 30' bonded to the semiconductor chip 30 and the protrusion part 22. Preferably, the bottomed hole 24c is arranged in proximity to the position where the protrusion part 22 is arranged. More preferably, the bottomed hole 24c is arranged adjacent to the position where the protrusion part 22 is arranged. As can be seen from FIG. 5A, a plurality of the bottomed holes 24c are arranged in the heat sink 20 at regular intervals along the protrusion part 22 so as to surround the area 30'. Furthermore, a plurality of the bottomed holes 24c may be further arranged at regular intervals along the inside of an area where the bottomed holes 24c are arranged so as to surround the area 30'.

Thus, in the third embodiment, the groove 24 is not formed in the heat sink 20 unlike the first embodiment, instead, a plurality of the bottomed holes 24c are arranged in the heat sink 20 to form the stress absorbing part 26, which can reduce stress caused by a warp of the semiconductor device 100 at the part where the protrusion part 22 is bonded to the substrate 10, as is the case with the first embodiment.

Fourth Embodiment

The outline of the semiconductor device according to the fourth embodiment of the present invention is described below with reference to FIGS. 6A and 6B.

Figure 6A:
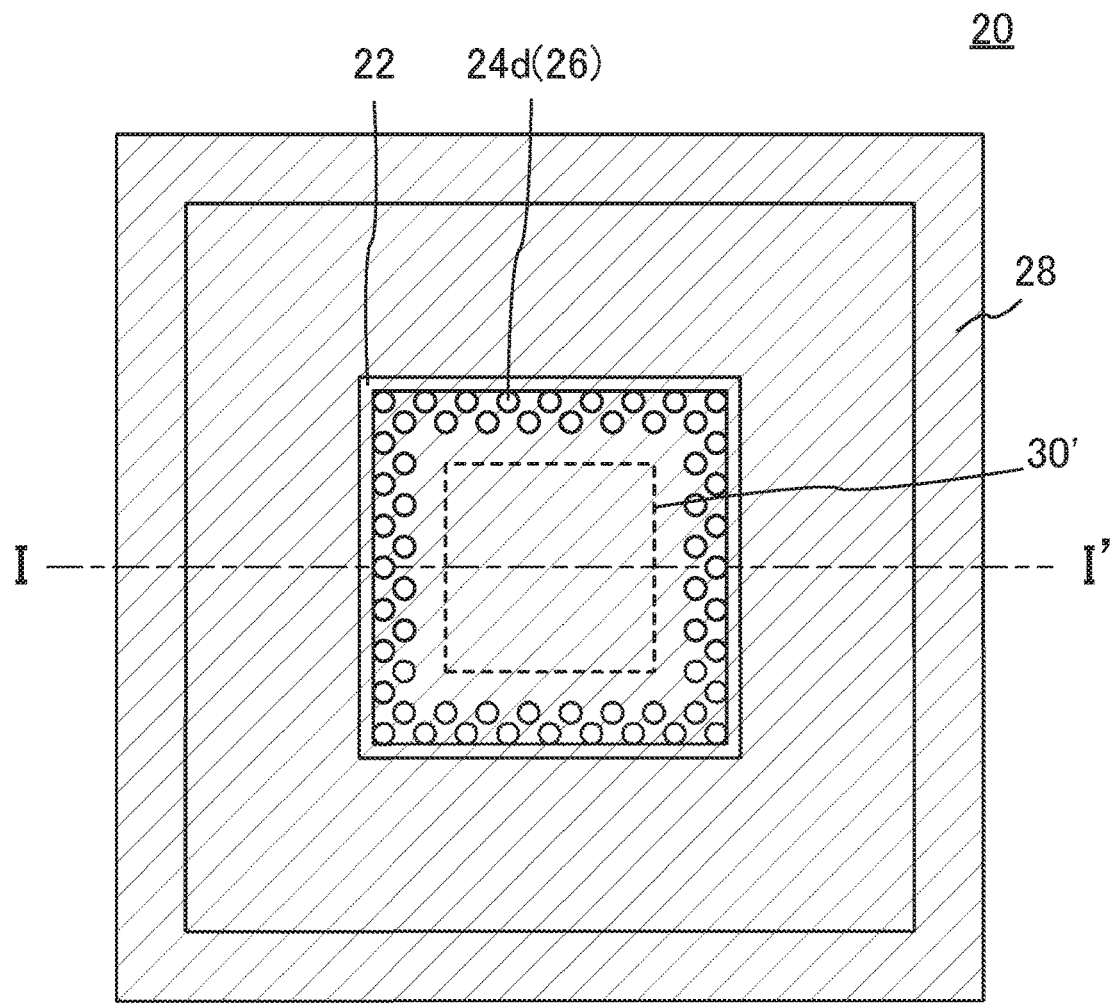
FIG. 6A is a top view of a heat sink of a semiconductor device according to a fourth embodiment of the present invention.
Figure 6B:
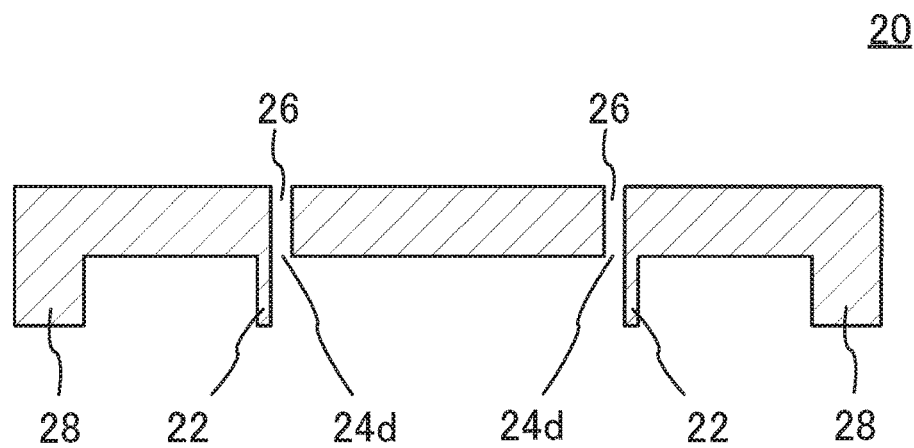
FIG. 6B is a cross section of the heat sink of the semiconductor device according to the fourth embodiment of the present invention.

FIG. 6A is a top view of the heat sink 20 of the semiconductor device according to the fourth embodiment. FIG. 6B is a cross section of the heat sink 20 along the line I-I' in FIG. 6A. The fourth embodiment is characterized in that a through hole 24d, which serves as the stress absorbing part 26 and passes from the surface opposing the substrate 10 to the surface being the outside of the semiconductor device, is arranged in the heat sink 20. The through hole 24d may be arranged in the same position as that where the bottomed hole 24c shown in the third embodiment is arranged. Preferably, the through hole 24d is arranged in proximity to the position where the protrusion part 22 is arranged. More preferably, the through hole 24d is arranged adjacent to the position where the protrusion part 22 is arranged.

In the fourth embodiment, rigidity is lowered around the part where a plurality of the through holes 24d (the stress absorbing parts 26) are arranged in the heat sink 20. This can reduce stress caused by a warp of the semiconductor device 100 at the part where the protrusion part 22 is bonded to the substrate 10, as is the case with the first embodiment.

Fifth Embodiment

The outline of the semiconductor device according to the fifth embodiment of the present invention is described below with reference to FIGS. 7A and 7B.

Figure 7A:
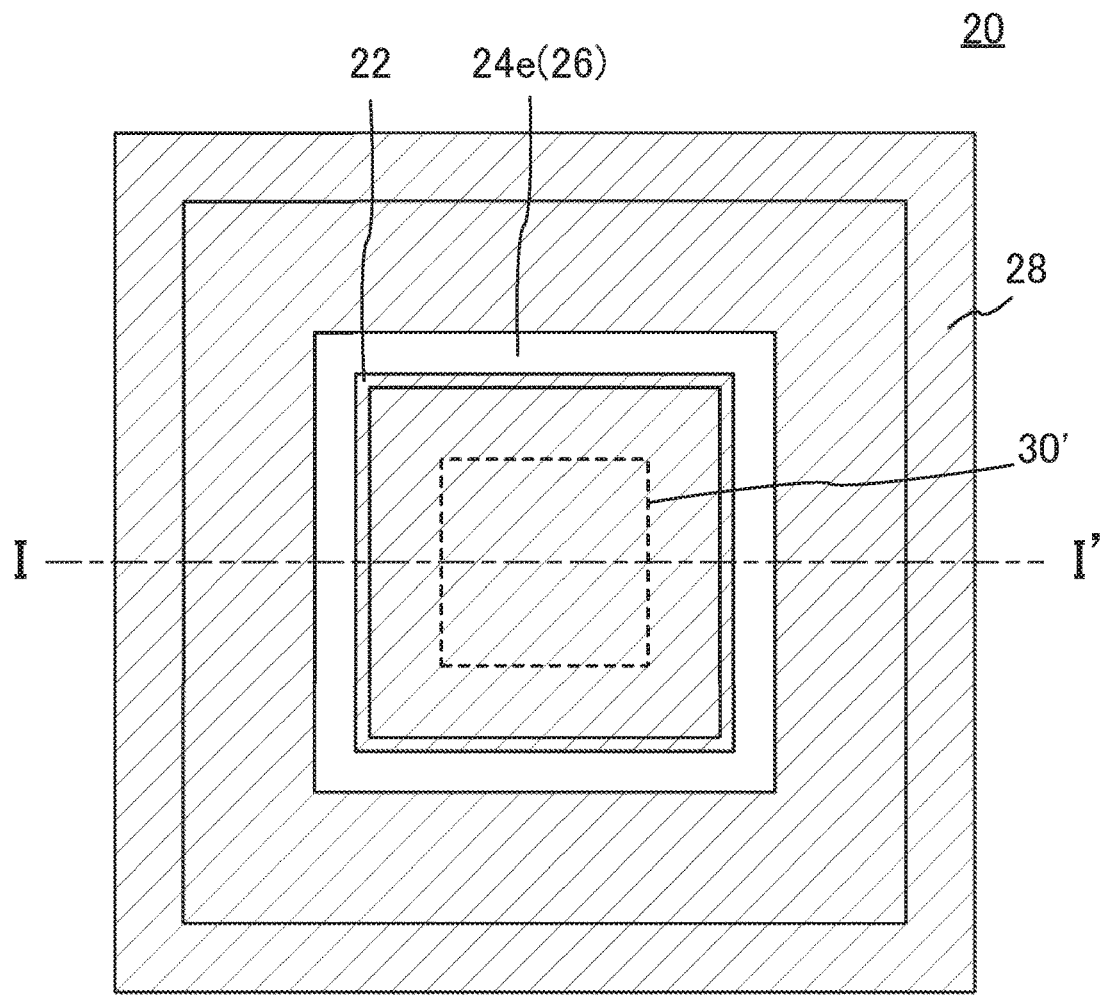
FIG. 7A is a top view of a heat sink of a semiconductor device according to a fifth embodiment of the present invention.
Figure 7B:
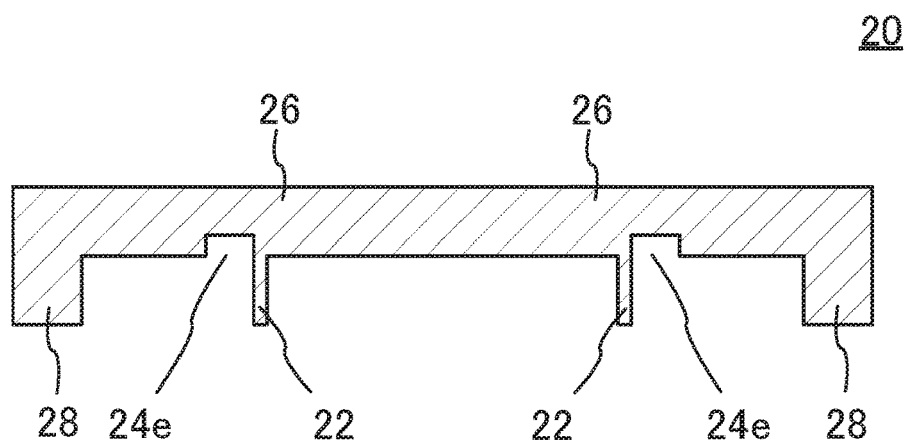
FIG. 7B is a cross section of the heat sink of the semiconductor device according to the fifth embodiment of the present invention.

FIG. 7A is a top view of the heat sink 20 of the semiconductor device according to the fifth embodiment. FIG. 7B is a cross section of the heat sink 20 along the line I-I' in FIG. 7A. The fifth embodiment is characterized in that a groove 24e is arranged outside the protrusion part 22, that is to say, between the protrusion part 22 and the fixing part 28 to form the stress absorbing part 26, unlike the first embodiment. Preferably, the groove 24e is arranged in proximity to the position where the protrusion part 22 is arranged. More preferably, the groove 24e is arranged adjacent to the position where the protrusion part 22 is arranged. The groove 24e is arranged outside the protrusion part 22 to also allow the stress to be reduced at the part where the protrusion part 22 is bonded to the substrate 10, as is the case with the first embodiment in which the groove 24 is arranged inside the protrusion part 22.

Other Embodiments

The first to fifth embodiments of the present invention are described above with reference to FIGS. 1 to 7B. However, the present invention is not limited to the above embodiments. The present invention can be implemented by appropriately modifying the above embodiments within a range not deviated from the gist of the invention or combining the embodiments with each other.

The first embodiment, for example, shows an example where the groove 24 is continuously arranged in a rectangular shape. However, the groove 24 may be intermittently arranged so as to surround the area 30'. Alternatively, a groove may be arranged in parallel to each side of the protrusion part 22 formed in a rectangular shape and bottomed holes or through holes may be formed at parts corresponding to the corners thereof. The grooves 24 and 24e may be arranged inside and outside of the position where the protrusion part 22 is arranged respectively by combining the first embodiment with the fifth embodiment. Although the example where the groove 24 is formed in a concave shape is shown above, the groove 24 may be formed in other different shapes such as a circular, a triangular shape, and others. The stress absorbing part 26 formed by the groove 24 or the like only has to be arranged between the part where the heat sink 20 is bonded to the semiconductor chip 30 and the fixing part 28 where the heat sink 20 is bonded and fixed to the substrate 10. It is preferable that the stress absorbing part 26 is arranged in a position near the protrusion part 22 from the viewpoint of the reduction of stress at the part where the protrusion part 22 is bonded to the substrate 10.

The first to third and fifth embodiments describe that the groove 24 or the like are arranged in the surface, opposing the substrate 10, of the heat sink 20, however the embodiments of the present invention are not limited to the above. The groove and the bottomed hole may be arranged in the surface opposite to the surface opposing the substrate 10, that is to say, in the surface exposed outside the semiconductor device 100.

[Simulation]

The following shows the results of a stress simulation for the semiconductor device according to an embodiment of the present invention and a comparative example thereof.

Structure of Comparative Examples

Figure 8:
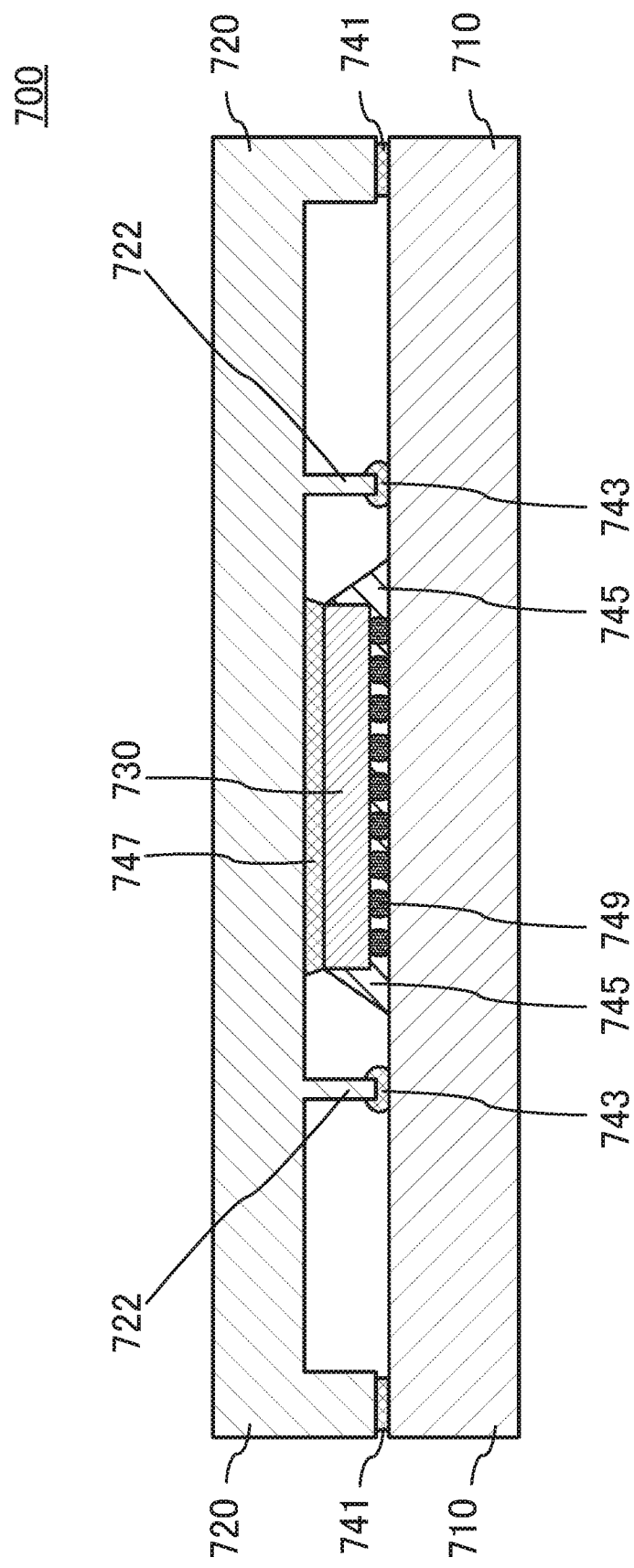
FIG. 8 is a cross section of a semiconductor device according to a comparative example.

FIG. 8 is a cross section of a semiconductor device 700 according to the comparative example. The semiconductor device 700 comprises a glass ceramic substrate 710. The glass ceramic substrate small in transmission loss is often used in a semiconductor package of a high-speed device. A semiconductor chip 730 is flip-chip connected on the glass ceramic substrate 710 via a bump 749 and a lid-like heat sink 720 is bonded to the upper surface of the semiconductor chip 730 via a thermal interface material 747. The heat sink 720 is bonded and fixed to the glass ceramic substrate 710 by an adhesive 741 at the outer circumferential part of the glass ceramic substrate 710. An underfill 745 is arranged between the substrate 710 and the semiconductor chip 30.

The heat sink 720 has a protrusion part 722 protruding toward the glass ceramic substrate 710 outside the area bonded to the semiconductor chip 730. The protrusion part 722 is bonded to the glass ceramic substrate 710 via a conductive adhesive 743 and electrically connected to the ground of the glass ceramic substrate 710.

Materials used as the main components of the semiconductor device 700 are given below. The lid-like heat sink 720 uses copper, the semiconductor chip 730 uses silicon, and the glass ceramic substrate 710 uses glass ceramic. The thermal expansion coefficients of the materials used as the components are given below. Those of copper, silicon, and glass ceramic are about 15 ppm, about 3.4 ppm, and about 9.5 ppm respectively. For this reason, at a low temperature ($-55°$ C., for example) in the temperature cyclic test at the manufacturing process of semiconductor device 700, the semiconductor device 700 is convexly-warped upward in FIG. 8 caused by the mismatch among the thermal expansion coefficients of the components. However, for the glass ceramic substrate 710, the warp is suppressed comparatively smaller, which hardly causes a problem that the parts where the components are boned to each other are peeled off.

Figure 9:
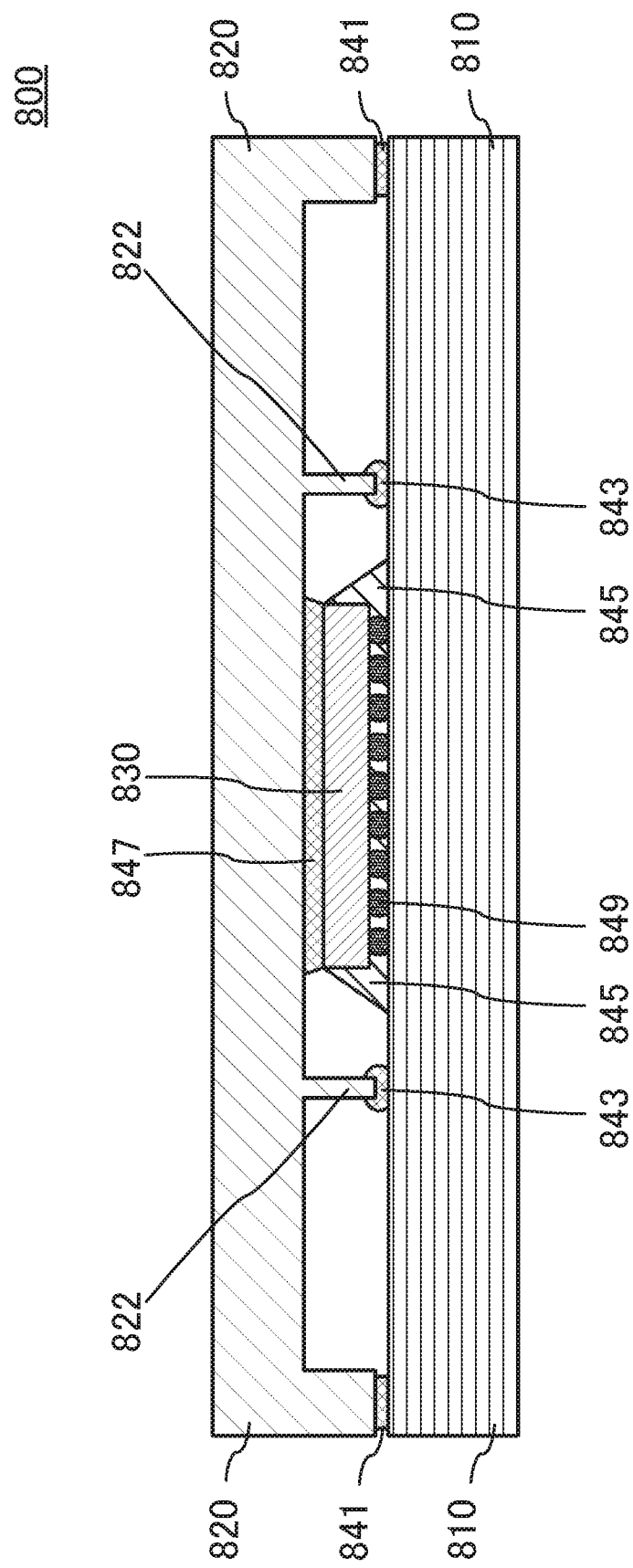
FIG. 9 is a cross section of a semiconductor device according to a comparative example.

A substrate adaptable to a high-speed device has been developed in recent years also in an organic substrate such as a buildup substrate. The organic substrate which is less expensive than a glass ceramic substrate is often used as the package substrate for the high-speed device. FIG. 9 shows a cross section of a semiconductor device 800 according to a comparative example. The semiconductor device 800 shown in FIG. 9 is the same as the semiconductor device 700 shown in FIG. 8 in structure, however, the semiconductor device 800 is different from the semiconductor device 700 in that an organic substrate 810 is used as a package substrate.

Materials used as the main components of the semiconductor device 800 are given below. A lid-like heat sink 820 uses copper, a semiconductor chip 830 uses silicon, and the organic substrate 810 is a substrate including an organic material. The thermal expansion coefficients of the materials used as the components are given below. Those of copper, silicon, and the organic substrate are about 15 ppm, about 3.4 ppm, and about 15 ppm respectively. Therefore, the organic substrate 810 shown in FIG. 9 is greater than the glass ceramic substrate 710 shown in FIG. 8 in the thermal expansion coefficient. At a low temperature ($-55°$ C., for example) in the temperature cyclic test, even the semiconductor device 800 using the organic substrate 810 as the package substrate is convexly-warped upward in FIG. 9. At this point, the parts where the components are boned to each other can be peeled off because the organic substrate 810 is greater than the glass ceramic substrate 710 shown in FIG. 8 in the warp. The application of stress to the part where the protrusion part 822 of the heat sink 820 is bonded to the organic substrate 810 can cause release the protrusion part 822 and the organic substrate 810, which may cause a problem that makes it difficult to keep the stability of a ground potential.

Example

Figure 10:
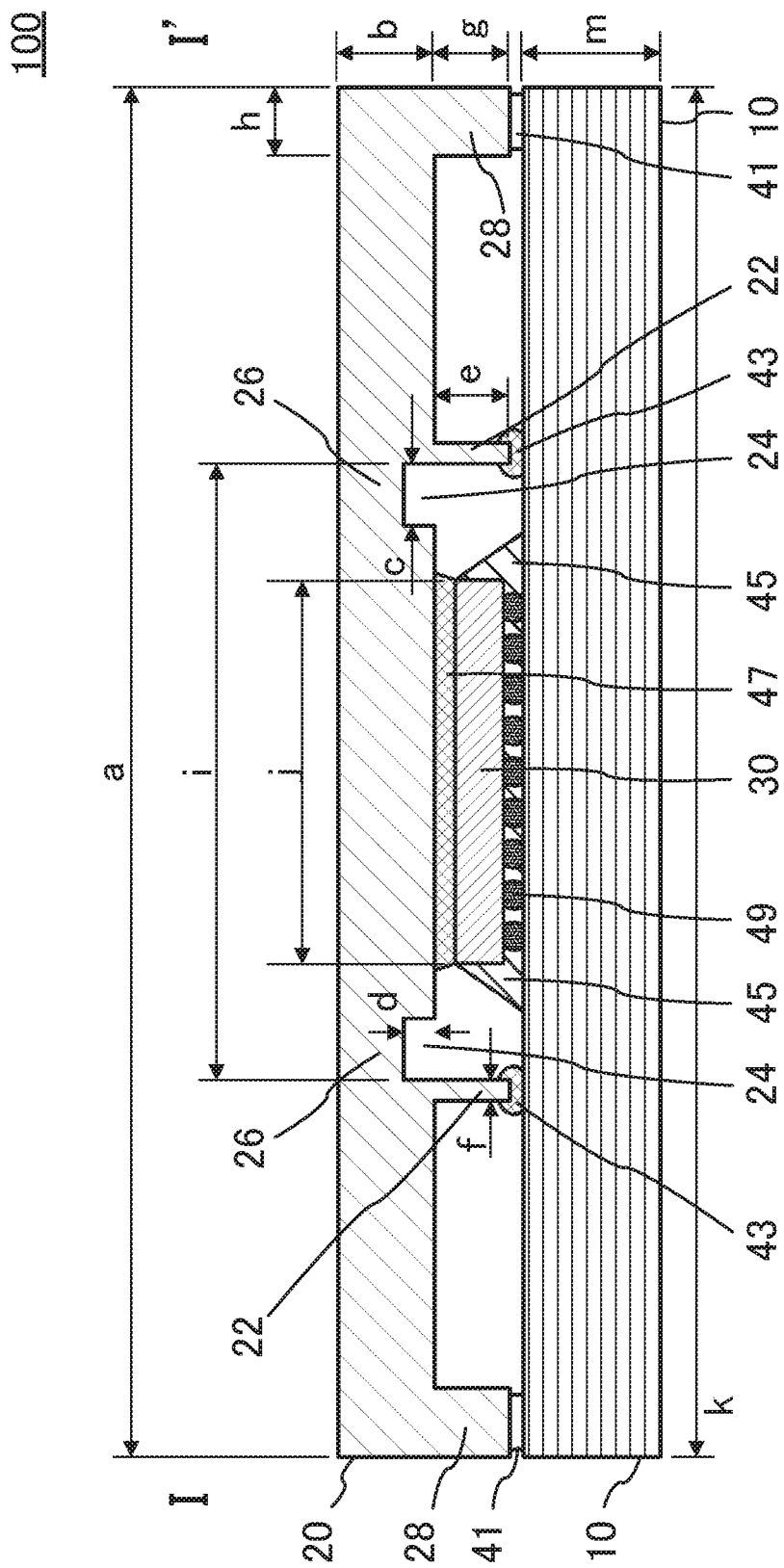
FIG. 10 is a cross section of the semiconductor device according to the first embodiment of the present invention.

FIG. 10 shows a cross section of a semiconductor device 100 according to one embodiment of the present invention. The semiconductor device 100 shown in FIG. 10 is the same as the semiconductor device 100 described in the first embodiment in structure. Materials used as the main components of the semiconductor device 100 are given below. The substrate 10 uses the organic substrate including an organic material, the heat sink uses copper, the adhesive 41 uses epoxy resin, the underfill 45 uses epoxy resin, the conductive adhesive 43 uses Ag paste, and the thermal interface material 47 uses a metal. The heat sink 20 is in a square shape, the length "a" of one side thereof is 26.5 mm and the thickness "b" thereof is 0.5 mm, the width "c" of the groove 24 is 4 mm and the depth "d" thereof is 0.3 mm, the length "e" of the protrusion part 22 is 0.3 mm and the thickness "f" thereof in the planar direction is 0.5 mm, the length "g" of the fixing part 28 is 0.7 mm and the thickness "h" thereof in the planar direction is 2 mm, and a distance "i" between the two protrusion parts 22 where the semiconductor chip 30 is arranged is 16 mm. The semiconductor chip 30 is in a square shape, the length "j" of one side thereof is 11 mm, and the semiconductor chip 30 is arranged at the center of the square substrate 10 and the heat sink 20. The length "k" of one side of the substrate 10 is 27 mm and the thickness "m" thereof is 0.99 mm. The width of the stress absorbing part 26 is 4 mm and the thickness thereof is 0.3 mm.

On the other hand, the semiconductor device according to the comparative example shall not have the groove 24 (the stress absorbing part 26) in FIG. 10 and others shall be the same in structure. A table 1 shows temperature and stress at the maximum stress in the part where the protrusion part 22 is bonded to the substrate 10 (referred to as a ground connection part) at a temperature cyclic test (−55° C. to 125° C.).

TABLE 1

| Structure | Ground connection part Maximum stress (Temperature: −55° C.) |
|---|---|
| Groove is not provided (comparative example) | 3.75 Mpa |
| Groove is provided (example) | 3.52 Mpa |

The maximum stress at the ground connection part in the semiconductor device without the groove 24 according to the comparative example was 3.75 Mpa. On the other hand, the maximum stress at the ground connection part in the semiconductor device with the groove 24 (i.e., with the stress absorbing part 26) according to the example was 3.52 Mpa. Therefore, it is clear from the simulation that the example according to an embodiment of the present invention could reduce more stress applied to the ground connection part than the comparative example at a temperature of −55° C.

Experimental Results

A table 2 shows the experimental results of the temperature cyclic test (−55° C. to 125° C.) for the semiconductor devices according to the example and the comparative example with the dimensions and structure same as those set in the above simulation. In the table 2, the number of the semiconductor devices subjected to the temperature cyclic test is taken as a denominator and the number of the semiconductor devices rejected in conduction tests applied to the devices is taken as a numerator. The reason the semiconductor devices are rejected in the conduction tests seems to be that a part of the protrusion part 22 is peeled off from the substrate 10 or the protrusion part 22 is wholly peeled off from the substrate 10 at the part where the protrusion part 22 of the heat sink 20 is bonded to the substrate 10.

TABLE 2

| | Temperature cycle | | | |
|---|---|---|---|---|
| Structure | 800 cyc | 1000 cyc | 1200 cyc | 1500 cyc |
| Groove is not provided (comparative example) | 0/30 | 6/30 | 13/22 | 4/7 |
| Groove is provided (example) | 0/30 | 0/30 | 0/28 | 3/26 |

With reference to the table 2, although all the semiconductor devices without the groove 24 of the comparative example were acceptable in the conduction tests at a cycle of 800, 6 of 30 semiconductor devices were rejected at a cycle of 1000, 13 of 22 semiconductor devices were rejected at a cycle of 1200, and 4 of 7 semiconductor devices were rejected at a cycle of 1500. On the other hand, for the semiconductor device with the groove 24 (with the stress absorbing part 26) of the example according to an embodiment of the present invention, 30, 30, and 28 semiconductor devices were subjected to the tests at cycles of 800, 1000, and 1200 respectively and, as a result, all of the semiconductor devices were acceptable. 3 of 26 semiconductor devices, however, were rejected at a cycle of 1500.

As described above, it was confirmed that the semiconductor device with the groove 24 (with the stress absorbing part 26) of the example according to an embodiment of the present invention could more substantially reduce the ratio in which semiconductor devices are rejected in the conduction tests carried out after the temperature cyclic tests than the semiconductor device without the groove 24 of the comparative example. For this reason, it was confirmed that the example according to an embodiment of the present invention was effective for preventing the protrusion part 22 from being peeled off from the substrate at the part where the protrusion part 22 is bonded to the substrate 10.

According to the present invention, the stress absorbing part having low rigidity is provided for the heat sink to allow reducing stress caused by the warp of the semiconductor device at the part where the protrusion part of the heat sink is bonded to the substrate and preventing the protrusion part from being peeled off from the substrate at the part where the protrusion part is bonded to the substrate. This can hold a stable electrical connection between the heat sink and the ground. Consequently, a highly reliable semiconductor device can be provided.

What is claimed is:

1. A semiconductor device, comprising:
a substrate;
a semiconductor chip on a first side of the substrate;
an underfill between the semiconductor chip and the first side of the substrate; and
a heatsink over the semiconductor chip, wherein the heatsink comprises:
  a central portion over the semiconductor chip;
  a fixing part coupled to the first side of the substrate;
  a protrusion part coupled to the first side of the substrate between the fixing part and the semiconductor chip; and
  a recessed groove between the central portion and the fixing part; and
a thermal interface material (TIM) between the central portion of the heatsink and the semiconductor chip, wherein the recessed groove is free of the underfill, and the TIM is discrete from the underfill;
wherein a thickness of the heatsink at the recessed groove is less than a thickness of the heatsink between the protrusion part and the fixing part, and the thickness at the recessed groove is less than a thickness of the central portion of the heatsink; and
wherein the underfill covers a lateral side of the semiconductor chip and a top side of the underfill is at a same level as a top side of the semiconductor chip.

2. The semiconductor device of claim 1, wherein:
the recessed groove comprises a through hole in the heatsink.

3. The semiconductor device of claim 2, wherein:
the through hole is adjacent to the protrusion part.

4. The semiconductor device of claim 2, wherein:
the heatsink comprises a first side and a second side opposite to the first side;
the first side of the heatsink faces the substrate; and
the through hole extends from the first side of the heatsink to the second side of the heatsink.

5. The semiconductor device of claim 1, wherein:
the recessed groove is U-shaped.

6. A semiconductor device, comprising:
a substrate;
a semiconductor chip on a first side of the substrate;
a lid on the first side of the substrate and over the semiconductor chip, wherein the lid comprises:
  a fixing part coupled to the first side of the substrate;
  a protrusion part coupled to the first side of the substrate between the fixing part and the semiconductor chip; and
  a recessed groove between the semiconductor chip and the protrusion part, wherein a thickness of the lid at the recessed groove is less than a thickness of the lid at a central portion of the lid located over the semiconductor chip, and the central portion of the lid extends beyond a footprint of the semiconductor chip;
a thermal interface material (TIM) between the central portion of the lid and the semiconductor chip; and
an underfill between the semiconductor chip and the first side of the substrate, wherein the underfill fully covers a lateral side of the semiconductor chip, and a top side of the underfill is flush with a top side of the semiconductor chip.

7. The semiconductor device of claim 6, wherein:
a rigidity of the lid at the recessed groove is less than the rigidity of the lid between the protrusion part and the fixing part.

8. The semiconductor device of claim 6, wherein:
a sidewall of the recessed groove is contiguous with a sidewall of the protrusion part.

9. The semiconductor device of claim 6, wherein:
the recessed groove is free of the underfill.

10. The semiconductor device of claim 6, wherein:
the recessed groove comprises a through hole in the lid.

11. The semiconductor device of claim 10, wherein:
the through hole is adjacent to the protrusion part.

12. The semiconductor device of claim 10, wherein:
the through hole extends from a first side of the lid to a second side of the lid.

13. The semiconductor device of claim 12, wherein:
the first side of the lid faces the substrate, and the second side of the lid is opposite to the first side of the lid.

14. The semiconductor device of claim 6, wherein:
the recessed groove is U-shaped.

15. A semiconductor device, comprising:
a substrate;
a semiconductor chip on a first side of the substrate;
a lid on the first side of the substrate and over the semiconductor chip, wherein the lid comprises:
  a fixing part coupled to the first side of the substrate;
  a central portion over the semiconductor chip; and
  a recessed groove between the central portion and the fixing part, wherein a thickness of the lid at the recessed groove is less than a thickness of the lid at the central portion of the lid and less than a thickness of the lid adjacent to the fixing part;
an underfill between the semiconductor chip and the first side of the substrate; and
a thermal interface material (TIM) between the central portion of the lid and the semiconductor chip;
wherein the underfill covers a lateral side of the semiconductor chip and a top side of the underfill is at a same level as a top side of the semiconductor chip.

16. The semiconductor device of claim 15, wherein:
the recessed groove comprises a through hole in the lid.

17. The semiconductor device of claim 16, wherein:
the lid comprises a first side and a second side opposite to the first side;
the first side of the lid faces the substrate; and
the through hole extends from the first side of the lid to the second side of the lid.

18. The semiconductor device of claim 15, wherein:
the recessed groove is free of the underfill.

19. The semiconductor device of claim 15, wherein:
the recessed groove is U-shaped.

* * * * *